United States Patent
Regev et al.

(10) Patent No.: US 7,237,172 B2
(45) Date of Patent: Jun. 26, 2007

(54) ERROR DETECTION AND CORRECTION IN A CAM

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 429 days.

(21) Appl. No.: 10/327,071

(22) Filed: Dec. 24, 2002

(65) Prior Publication Data

US 2004/0120173 A1    Jun. 24, 2004

(51) Int. Cl.
*H03M 13/00*    (2006.01)
*G11C 29/00*    (2006.01)
*G06F 12/00*    (2006.01)

(52) U.S. Cl. .............. 714/754; 714/718; 714/719; 365/49; 711/108

(58) Field of Classification Search ........... 714/718, 714/763, 746, 777, 774, 752, 768; 365/200, 365/201, 49; 711/108
See application file for complete search history.

(56) References Cited

U.S. PATENT DOCUMENTS

| | | | | |
|---|---|---|---|---|
| 5,099,484 A | * | 3/1992 | Smelser .............. | 714/761 |
| 5,109,348 A | * | 4/1992 | Pfeiffer et al. .............. | 345/505 |
| 5,754,753 A | * | 5/1998 | Smelser .............. | 714/8 |
| 5,813,038 A | * | 9/1998 | Thome et al. .............. | 711/154 |
| 5,960,459 A | * | 9/1999 | Thome et al. .............. | 711/154 |
| 6,041,389 A | * | 3/2000 | Rao .............. | 711/108 |
| 6,430,073 B1 | * | 8/2002 | Batson et al. .............. | 365/49 |
| 6,549,442 B1 | * | 4/2003 | Lu et al. .............. | 365/49 |
| 6,597,595 B1 | * | 7/2003 | Ichiriu et al. .............. | 365/49 |
| 6,662,333 B1 | * | 12/2003 | Zhang et al. .............. | 714/767 |
| 6,690,595 B1 | * | 2/2004 | Srinivasan et al. .............. | 365/49 |
| 6,728,124 B1 | * | 4/2004 | Ichiriu et al. .............. | 365/49 |
| 2003/0007408 A1 | * | 1/2003 | Lien et al. .............. | 365/222 |
| 2004/0123213 A1 | * | 6/2004 | Welbon et al. .............. | 714/752 |
| 2005/0036363 A1 | * | 2/2005 | Shau .............. | 365/159 |

* cited by examiner

*Primary Examiner*—Phung My Chung
(74) *Attorney, Agent, or Firm*—Dickstein Shapiro LLP

(57) ABSTRACT

An error detection and correction circuit is connected to at least one memory bank of a CAM device. During background processing (i.e., when the CAM is not performing reading, writing or searching functions) the error detection and correction circuit tests all of the CAM locations that it is connected to in sequence. If an error is detected, the error detection and correction circuit rewrites the CAM location with the correct data. Multiple error correction and detection circuits can be used in the CAM device to test multiple CAM locations simultaneously.

33 Claims, 7 Drawing Sheets

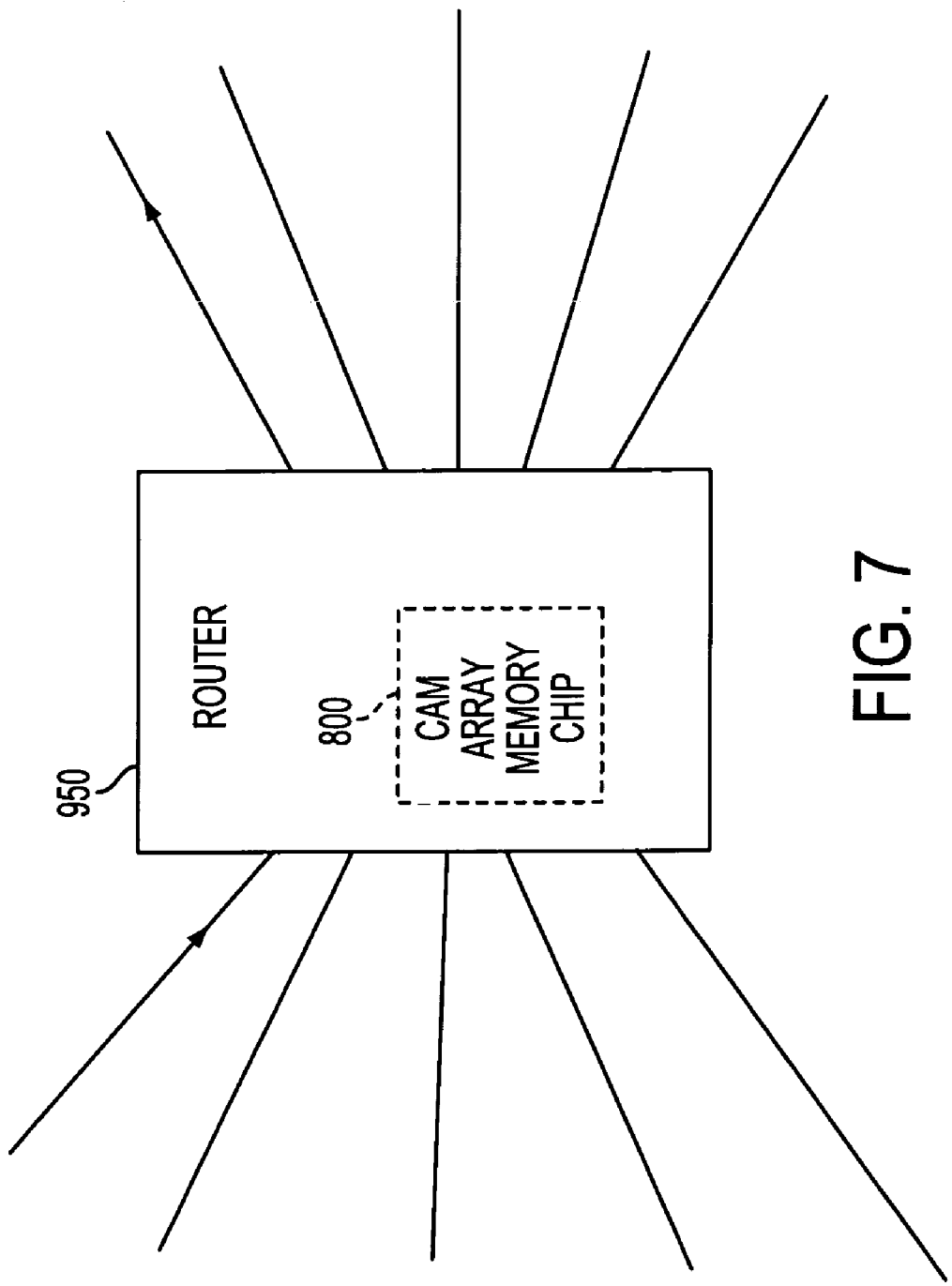

ERROR DETECTION AND CORRECTION IN A CAM

FIELD OF THE INVENTION

The present invention relates generally to semiconductor memory devices and, more particularly to error detection and correction in a content addressable memory (CAM) device.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM and SRAM). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has a pair of status bits that keep track of whether the location is storing valid information in it or is empty and available for writing.

Once information is stored in a memory location, it is found by comparing every bit in memory with data in the comparand register. When the content stored in the CAM memory location does not match the data in the comparand register, the local match detection circuit returns a no match indication. When the content stored in the CAM memory location matches the data in the comparand register, the local match detection circuit returns a match indication. If one or more/local match detect circuits return a match indication, the CAM device returns a "match" indication. Otherwise, the CAM device returns a "no-match" indication. In addition, the CAM may return the identification of the address location in which the desired data is stored or one of such addresses if more than one address contained matching data. Thus, with a CAM, the user supplies the data and gets back the address if there is a match found in memory.

CAMs are often used to hold routing tables for data networks. Some of these tables are "learned" from the data passing through the network. Other tables, however, are fixed tables that are loaded into the CAM by a system controller. These fixed tables reside in the CAM for a relatively long period of time. As such, these tables are prone to "soft errors," where the data in the CAM is changing (or has changed) as a result of an unknown, or unpredictable event, such as a glitch. If the soft error is not detected, the whole routing process may become flawed and messages would be sent to the wrong destinations.

Similarly, other applications using CAM memory devices may also experience soft errors, which could be disruptive to the application. It is desirable to detect these errors before the application uses the corrupt data. Furthermore, it is desirable to correct the errors in the CAM once the errors are detected. Accordingly, there is a desire and need for an error detection and correction scheme for a CAM device.

It is also desirable to implement the error detection and correction scheme for the CAM in a background process that does not interfere with the reading, writing and searching functions of the CAM device.

SUMMARY OF THE INVENTION

The present invention provides an error detection and correction scheme for a CAM device.

The present invention provides an error detection and correction scheme for the CAM that operates in the background such that it does not interfere with the reading, writing and searching functions of the CAM.

The above and other features and advantages are achieved by providing a CAM device with at least one error detection and correction circuit. An error detection and correction circuit is connected to at least one memory bank of the CAM. During background processing (i.e., when the CAM is not performing reading, writing or searching functions) the error detection and correction circuit tests all of the CAM locations it is connected to in sequence. If an error is detected, the error detection and correction circuit rewrites the tested CAM location data with the correct data. Multiple error correction and detection circuits can be used in the CAM device to test multiple CAM locations simultaneously.

BRIEF DESCRIPTION OF THE DRAWINGS

The foregoing and other advantages and features of the invention will become more apparent from the detailed description of exemplary embodiments provided below with reference to the accompanying drawings in which:

FIG. 7 is a block diagram illustrating a network router utilizing a CAM constructed in accordance with an embodiment of the invention.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

Since soft errors are unpredictable, it is difficult to have a system that is absolutely error free during its entire operation. It should also be noted that some causes of soft errors are known. Examples include radiation, cosmic rays, alpha particles, etc. But the effect of these causes is unpredictable. Because there is little chance that the system will be error free, a low rate of errors (i.e., number of errors in a given time period) is to be expected and must be tolerated. This is referred to herein as the "maximum acceptable error rate." If an error detection and correction scheme is added to a CAM device, the entire CAM should be repeatedly searched for errors. Any errors that are found should be corrected. If the detection and correction can be performed in a time period that is significantly shorter than the time period allowed for a single error, the system should be guaranteed an error rate that is lower than the desired maximum acceptable error rate. It should be appreciated that the maximum acceptable error rate is system dependent and that the invention is not limited to a specific rate.

Figure 1:
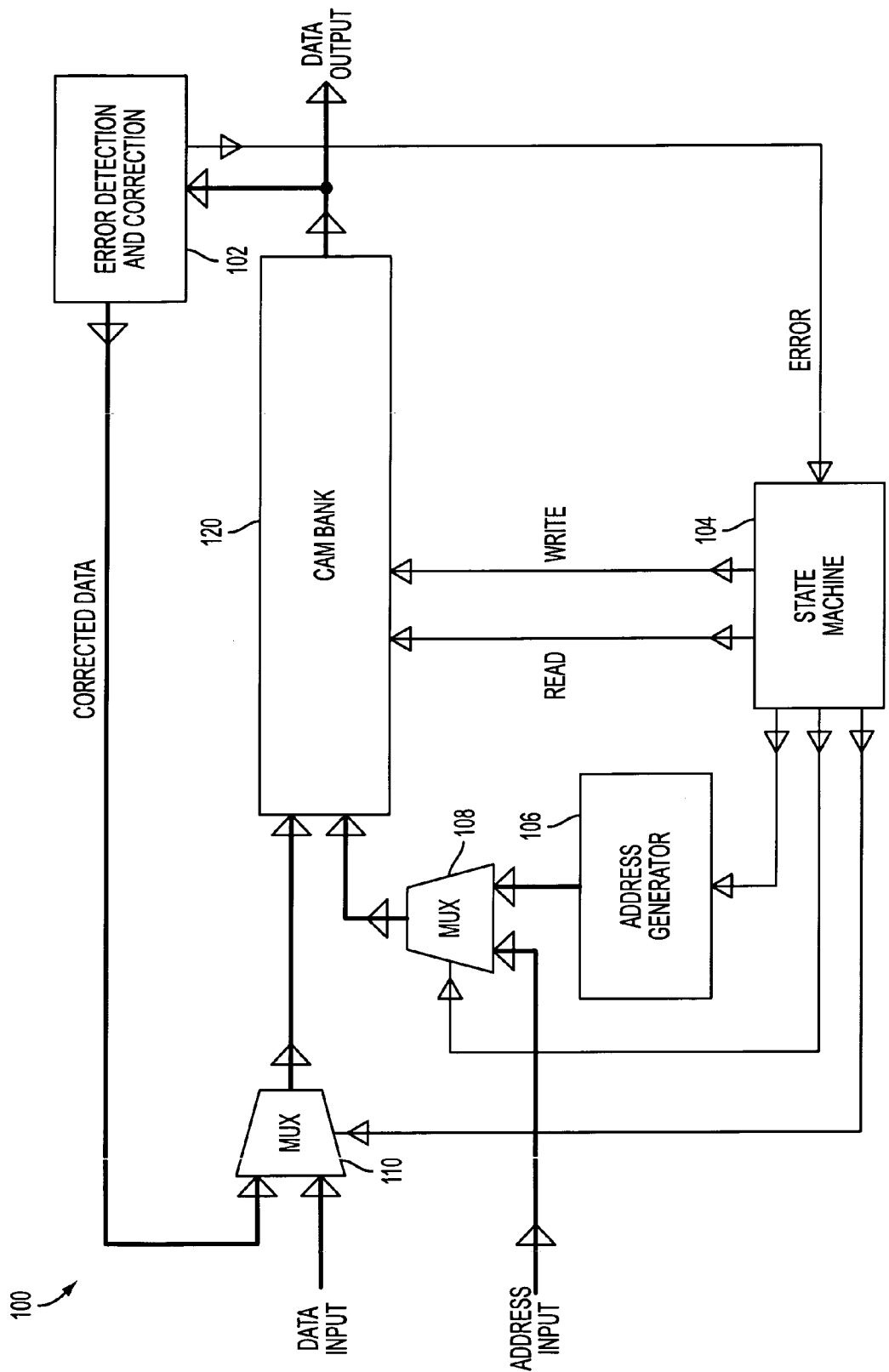
FIG. 1 is a block diagram illustrating a portion of a CAM device comprising exemplary error correction and detection circuitry constructed in accordance with an embodiment of the invention.

FIG. 1 illustrates a portion of a CAM device 100 containing exemplary error correction and detection circuitry constructed in accordance with an embodiment of the invention. The device 100 includes a bank 120 of CAM memory and error detection and correction circuitry. The illustrated error detection and correction circuitry comprises an error detection and correction circuit 102, a state machine 104, an address generator 106, and two multiplexers 108, 110.

The state machine 104 is responsible for controlling the error correction and detection process. The state machine 104 issues read and write signals READ, WRITE to the bank 120 when it is time to access the bank 120 for a read or write operation, respectively. The state machine 104 also supplies a signal to the address generator 106, when it is time for the address generator 106 to generate a new CAM address. The output of the address generator 106 is an address used to access the bank 120 during the error correction and detection process. The address is sent to the first multiplexer 108.

The state machine 104 is connected to and controls the first multiplexer 108. The state machine 104 sends a signal with a first value to the first multiplexer 108 to allow the address generated by the address generator 106 to address the bank 120. The state machine 104 sends a signal with a second value to the first multiplexer 108 to allow an address ADDRESS INPUT generated during the normal operation (i.e., not an error detection and correction process) of the CAM 100 to address the bank 120.

The state machine 104 is connected to and controls the second multiplexer 110. The state machine 104 sends a signal with a first value to the second multiplexer 110 to allow data CORRECTED DATA from the error correction and detection circuit 102 to be written into the bank 120. The state machine 104 sends a signal with a second value to the second multiplexer 110 to allow data DATA INPUT generated during the normal operation (i.e., not an error detection and correction process) of the CAM 100 to be written into the bank 120.

The state machine is connected to receive a signal ERROR from the error correction and detection circuit 102. As will be described below, this signal ERROR will have one value when the error correction and detection circuit 102 detects an error in the tested CAM location and a second different value when the error correction and detection circuit 102 detects that there was no error. The error correction and detection circuit 102 inputs the data associated with the tested CAM location from the bank as well as extra bits associated with the data. The extra bits may be stored as an extension to the CAM location or in a special RAM (not shown) at an address identical to the address of the CAM location. If the error correction and detection circuit 102 detects and error, the circuit 102 will correct the data (described below) and output corrected data CORRECTED DATA to the bank 120 (through the second multiplexer 110).

In operation, except when the CAM 100 is being instructed by the user, the state machine 104 controls the error detection process as an autonomous background process. In response to a signal from the state machine 104, the address generator 106 generates the address of the CAM location to be checked. It is desirable, but not essential, to test CAM words, as opposed to bytes or half-words, to speed up the process. For the purposes of this description, the error correction and detection process will test CAM words. The generated address is applied to the CAM bank 120 via the first multiplexer 108 (under a control signal from the state machine 104) and a read signal READ is applied to the bank 120 from the state machine 104. The data stored in the selected word from the bank 120 is read and combined with error detection bits associated with that word. The extra bits may be stored as an extension to the CAM word or in a special RAM (not shown) at an address identical to the address in the CAM word.

The error detection and correction circuit 102 performs an error detection process using the data read from the CAM word and extra bits. If no error is detected, the error detection and correction circuit 102 alerts the state machine 104 that there is no error (i.e., ERROR has a value indicating no error). The state machine 104 instructs the address generator 106 to generate the next address so the next CAM word to be tested may be accessed from the bank 120.

If an error is detected, the error detection and correction circuit 102 starts an error correction process. The error detection and correction circuit 102 alerts the state machine 104 that there is an error (i.e., ERROR has a value indicating an error has occurred). The resulting corrected data CORRECTED DATA is written into the tested CAM location via the second multiplexer 110, which is under the control of the state machine 104. The state machine 104 also generates the write signal WRITE that is applied to the bank 120 to initiate the write operation. The writing of the corrected data CORRECTED DATA overwrites the existing erroneous data. After the error is corrected, the error detection and correction circuit 102 alerts the state machine 104 that the error has been corrected (i.e., ERROR has a value indicating no error) so that the state machine 104 can continue error detection on the next CAM word to be tested.

It should be appreciated that any error detection and correction algorithm can be used to practice the invention. Accordingly, the number of extra bits required to perform the error detection and correction will depend upon the algorithm used. For example, using Hamming error coding, the number of extra bits is $n=\log(2)m+1$, where m is the number of data bits in the CAM word being tested.

It should be noted that the error correction process may be executed over several clock periods depending on the number of extra bits. Generally, the process should only take a relatively small number of clock periods and only during the times that an error needs to be corrected, which should be rare. Thus, the time required to test (and correct if needed) a whole CAM bank 120, two or four banks 120, is short enough to guarantee that an error may exist for only a relatively short period of time. Thus, the error rate is very small.

CAM devices continue to grow in size. A single error detection and correction circuit for a CAM device may not be able to process the entire CAM in a time short enough to satisfy the required maximum allowable error rate. Thus, it is desirable to add an error detection and correction circuit to each bank, every couple of banks, every fourth bank, etc. These additional error correction and detection circuits would operate simultaneously and independent of each other. This reduces the number of CAM words that each error correction and detection circuit must test. This way, there is ample processing power to test and correct (if necessary) the entire CAM in a time that is better than the time associated with the maximum allowable error rate.

Figure 2:
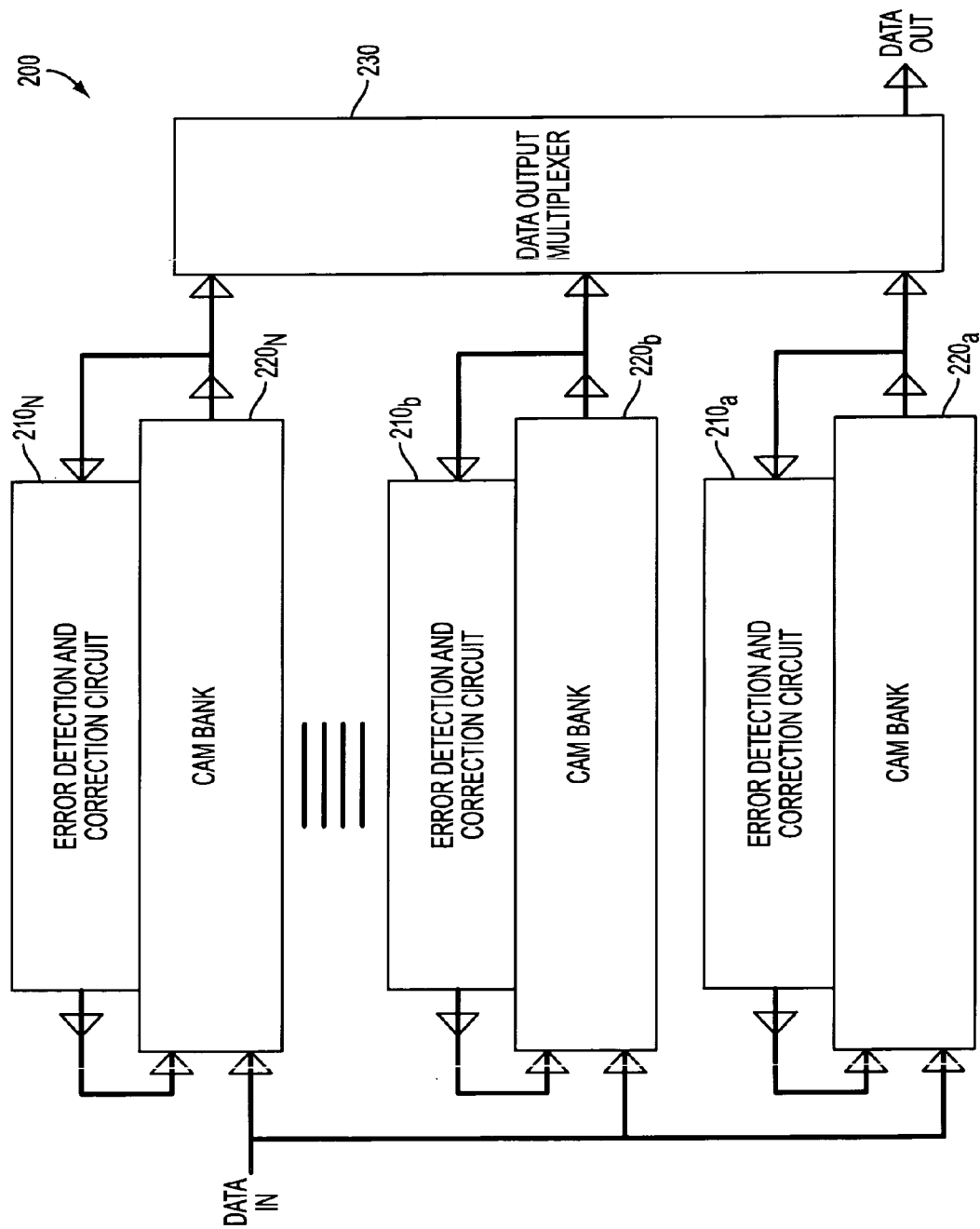
FIG. 2 is a block diagram illustrating a portion of a CAM device comprising a plurality of exemplary error correction and detection circuits constructed in accordance with an embodiment of the invention.

To check an entire CAM device in a very short time period, a plurality of error correction and detection circuits is used. FIG. 2 is a block diagram illustrating an example of CAM device 200 comprising multiple error correction and detection circuits 210a, 210b, . . . , 210n comprising error correction and detection circuitry illustrated in FIG. 1. In the illustrated embodiment, each error correction and detection circuit 210a, 210b, . . . , 210n is connected to and associated with its own bank 220a, 220b, . . . , 220n of CAM memory. It should be appreciated that each error correction and detection circuit 210a, 210b, . . . , 210n could be connected to and associated with two, three, four, or any desired number of CAM banks.

Each CAM bank 220a, 220b, . . . 220n inputs data DATA IN associated with the normal operation (i.e., not an error detection and correction process) of the CAM device 200. Each CAM bank 220a, 220b, . . . 220n outputs data to a data output multiplexer 230. The output multiplexer 230 has an output DATA OUT based on the data it receives from the banks 220a, 220b, . . . 220n. Each CAM bank 220a, 220b, . . . 220n also outputs data to its respective error correction and detection circuit 210a, 210b, . . . , 210n during error detection and correction processing. Similarly, each CAM bank 220a, 220b, . . . 220n inputs data from its respective error correction and detection circuit 210a, 210b, . . . , 210n during error detection and correction processing.

Error detection and correction is performed as described above with respect to FIG. 1, with the lone exception that each CAM bank 220a, 220b, . . . 220n is being tested simultaneously and independently of each other. It is also desirable for the error detection and correction circuitry to operate in the background so as not to interfere with the standard operations (i.e., the reading, writing and searching functions) of the CAM. For the error correction and detection circuitry to operate in the background and to meet the minimum error rate requirement, a certain percentage of the cycles must be available where the error correction circuits can perform the error checking function. One way this is accomplished is by using CAMs designed such that read and write operations are completely independent of the search process such that a memory read or write can occur at the same time as a search without the two operations interfering with one another. With such a CAM, an error detection cycle can occur at the same time as a CAM search operation. Since in most applications the majority of CAM cycles are used for search operations, performing a background error correction at the same time is possible.

Some CAM devices are constructed using DRAM memory cells. As is known in the art, DRAM memory cells use capacitors to store charges representing the value of the stored data. These stored charges deplete over time due to leakage. As such, DRAM devices use a refresh process, where data in the cells are read periodically and rewritten into the cells, to ensure the validity of the stored data by maintaining the appropriate charge in the capacitors. In CAM devices based on DRAM technology, the error detection and correction processing can be performed in the background as is currently done for the refresh process. It is desirable to combine the error detection and correction processing with the refresh processing when the CAM consists of DRAM memory cells.

Further, since CAM devices continue to grow in size a single refresh and error detection and correction circuit may not be sufficient to process the entire CAM in a time short enough to satisfy the required maximum allowable error rate. Thus, it is desirable to incorporate multiple refresh and error detection and correction circuits, with each circuit operating simultaneously and independently of each other. Having error correction and detection associated with every refresh circuit, for example, guarantees that the error correction rate will be equal to the refresh rate. It should be appreciated that if higher rates are required, then more refresh and error and correction circuits can be used. Similarly, it should be appreciated that if a lower rate was required, then less refresh and error and correction circuits can be used. Thus, the number of refresh and error and correction circuits is system and desired performance dependent.

Figure 3:
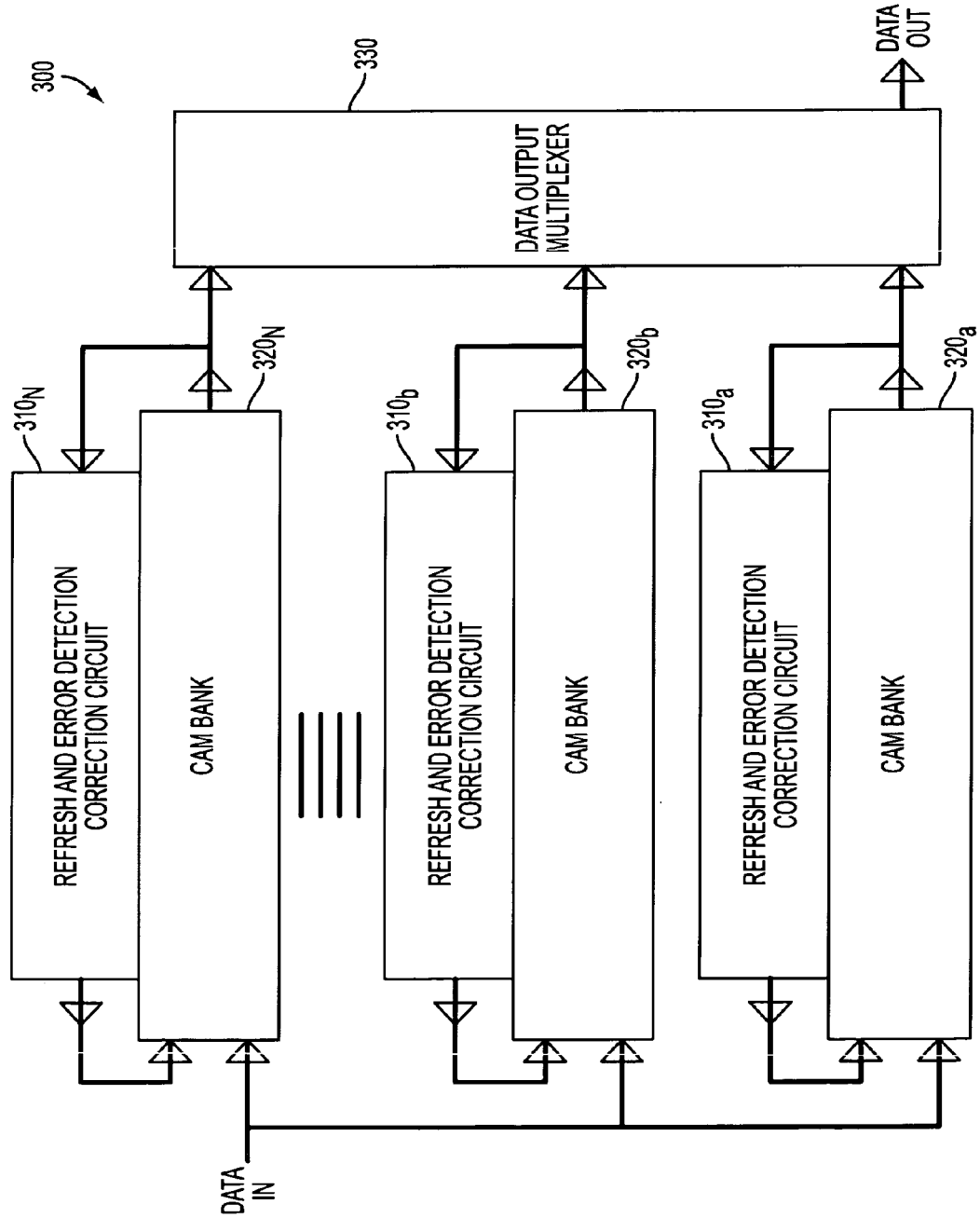
FIG. 3 is a block diagram illustrating a portion of a CAM device comprising a plurality of exemplary refresh and error correction and detection circuits constructed in accordance with an embodiment of the invention.

FIG. 3 is a block diagram illustrating a CAM device 300 comprising multiple exemplary refresh and error correction and detection circuits 310a, 310b, . . . , 310n comprising error correction and detection circuitry illustrated in FIG. 1. In the illustrated embodiment, refresh and error correction and detection circuit 310a, 310b, . . . , 310n is connected to and associated with its own batik 320a, 320b, . . . , 320n of CAM memory. It should be appreciated that each refresh and error correction and detection circuit 310a, 310b, . . . , 310n could be connected to and associated with two, three, four, or any desired number of CAM banks.

Each CAM bank 320a, 320b, . . . 320n inputs data DATA IN associated with the normal operation (i.e., not an error detection and correction process) of the CAM device 300. Each CAM bank 320a, 320b, . . . 320n outputs data to a data output multiplexer 330. The output multiplexer 330 has an output DATA OUT based on the data it receives from the banks 320a, 320b, . . . 320n. Each CAM bank 320a, 320b, . . . 320n also outputs data to its respective refresh and error correction and detection circuit 310a, 310b, . . . , 310n during error detection and correction processing. Similarly, each CAM bank 320a, 320b, . . . 320n inputs data from its respective refresh and error correction and detection circuit 310a, 310b, . . . , 310n during error detection and correction processing.

Error detection and correction is performed as described above with respect to FIG. 1, with the lone exception that each CAM bank 320a, 320b, . . . 320n is being tested simultaneously and independent of each other. In operation, the device 300 will perform error correction and detection during the refresh process. As noted above, the refresh process typically comprises repeatedly reading the memory locations and rewriting the contents of these locations at a predetermined rate. To practice the invention, every time the memory is read during the refresh process, it will also be searched for errors and corrected (if necessary) as described above with respect to FIG. 1. This procedure will guarantee that if there was an error (e.g., soft error) in the memory location, it can only last for the duration 'between two refresh cycles. If the refresh process is done at a high rate, then the duration for a possible error will be very short, significantly shorter than the maximum allowable time associated with the maximum allowable error rate.

It should be appreciated that the error correction and detection process of the invention may also be performed in a CAM constructed of SRAM memory cells. Since typical SRAM memories do not have a refresh process, the error correction and detection process of the invention would require its own processing or may be implemented in a periodic test process already performed on the SRAM (if applicable) if the test process is performed at a rate that is better than the maximum allowable error rate.

Figure 4:
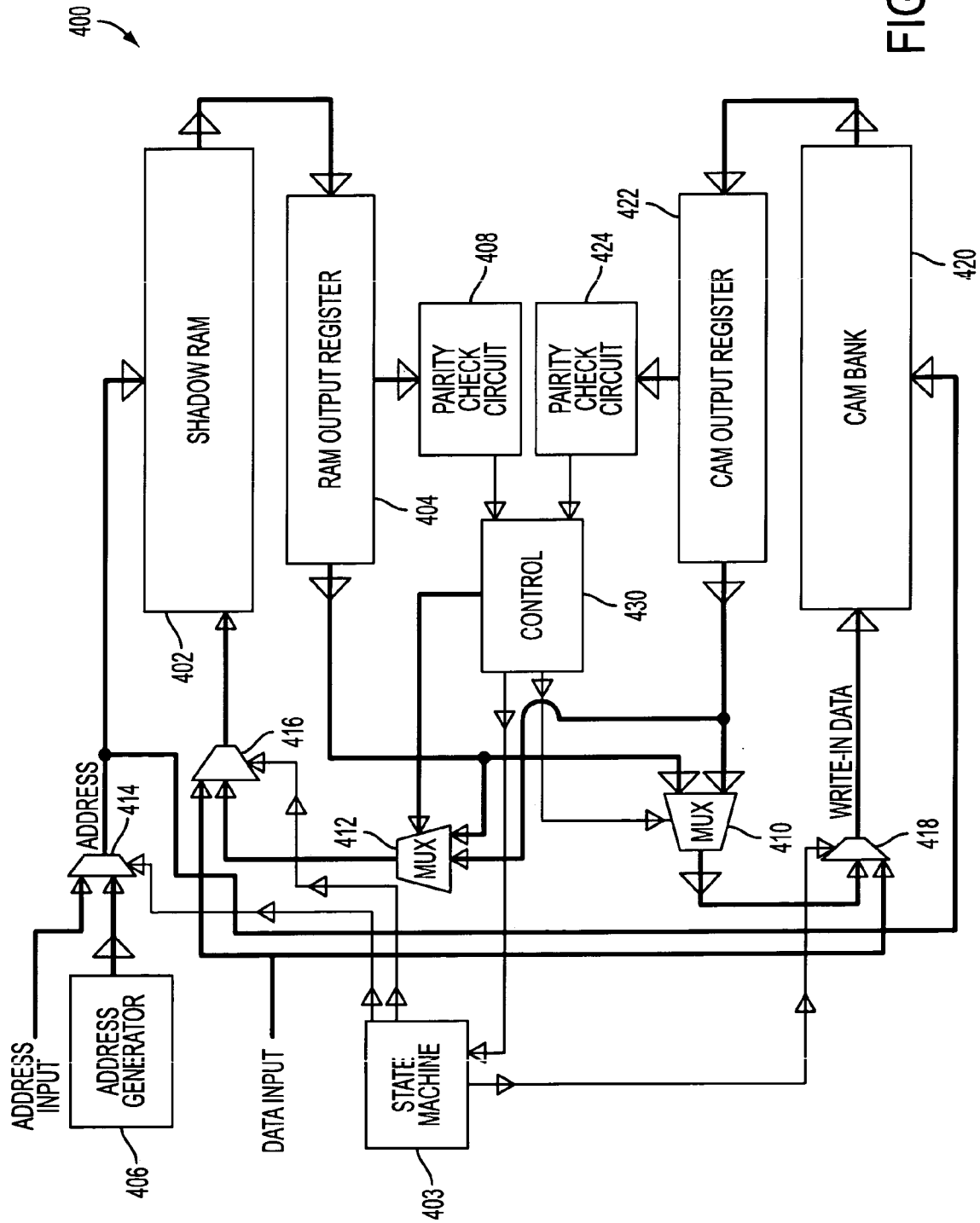
FIG. 4 is a block diagram illustrating portion of a CAM device comprising another exemplary error correction and detection circuit constructed in accordance with another embodiment of the invention.

FIG. 4 is a block diagram illustrating a portion of a CAM device 400 comprising another exemplary error correction and detection circuit constructed in accordance with another embodiment of the invention. In this embodiment, the error detection and correction process uses a shadow RAM 402 in combination with CAM 420 on the same memory device. The shadow RAM 402 retains a copy of every word in the CAM 420. The data in the RAM 402 and CAM 420 are repeatedly checked for errors. Detected errors are corrected (described below in more detail). Similar to the other embodiments of the invention (described above with respect to FIGS. 1–3), the error correction and detection process of this embodiment operates in the background so as not to interfere with the normal operation of the CAM memory device and to keep the memory error free.

In addition to the shadow RAM 402 and the CAM 420, the device 400 comprises a state machine 403, RAM output register 404, an address generator 406, a first parity check circuit 408, control circuit 430, five multiplexers 410, 412, 414, 416, 418, a CAM output register 422, and a second parity check circuit 424. The address generator 406 supplies address information ADDRESS to the RAM 402 and CAM 420 banks (via multiplexer 414 under the control of the state machine) during error detection and correction processing. During other processing (i.e., non-error detection and correction processing), an externally generated address input ADDRESS INPUT is sent to the RAM 402 and CAM 420 banks (via multiplexer 414 under the control of the state machine 403). The address generator 406 is controlled by the state machine 403, as described above with respect to FIG. 1, to ensure that each location in the CAM 420 and RAM 402 is tested.

The shadow RAM 402 outputs its data to the RAM output register 404, which outputs the RAM data to the first and second multiplexers 410, 412. Similarly, the CAM 420 outputs its data to the CAM output register 422, which also outputs the CAM data to both multiplexers 410, 412. Both multiplexers 410, 412 are under the control of the control circuit 430. As will be described below, the first multiplexer 410 provides either the RAM data or the CAM data to the CAM as write data WRITE-IN DATA when the contents of the CAM 420 need to be re-written. As will be described below, the second multiplexer 412 provides CAM data to the RAM 402 only when the contents of the RAM 402 need to be corrected. Otherwise, the previous contents of the RAM 402 are rewritten (if desired). The decision whether to re-write the contents of the CAM 420 when there is no error is based in-part on whether the CAM 420 comprises DRAM cells or SRAM cells. If the CAM 420 comprises DRAM cells, then it is desirable to re-write the contents of the CAM 420 to complete the refresh cycle. If the CAM 420 comprises SRAM cells, there is no need to refresh its contents and thus, there would be no need to re-write the CAM's 420 contents. If, however, the user so desires, the CAM 420 comprised of SRAM cells could also be rewritten.

The RAM output register 404 also outputs the RAM data to the first parity check circuit 408. The first parity check circuit 408 determines if the RAM data has a parity error or not. The first parity check circuit 408 outputs a signal to the control circuit 430. This signal has a first value if the RAM data has a parity error and a second different value if the RAM data does not have a parity error. Similarly, the CAM output register 422 outputs the CAM data to the second parity check circuit 424. The second parity check circuit 424 determines if the CAM data has a parity error or not. The second parity check circuit 424 outputs a signal to the control circuit 430. This signal has a first value if the CAM data has a parity error and a second different value if the CAM data does not have a parity error.

The control circuit 430 uses the two signals input from the two parity check circuits 408, 424 to determine whether the CAM 420 or RAM 402 have an error and whether error correction to either of these memories is required (described below in more detail).

It is desired that the CAM 420 and RAM 402 cohabit the same die. The CAM 420 and RAM 402 have the same number of bits and addresses. Whenever a word is written into an addressed CAM location, the same data is also written into the same address in the shadow RAM. Input data DATA INPUT is input into the RAM 402 (via multiplexer 416) and CAM 420 (via multiplexer 418) during non-error detection and correction processing. The multiplexers 416, 418 are controlled by the state machine 403.

In the error correction and detection operation, the content of every CAM word is read sequentially. This can be performed as part of the refresh operation in DRAM based CAMs or as part of a periodic error correction/detection process or a periodic test operation in SRAM based CAMs. Every time a word is read from the CAM 420, a word in the same address in the RAM 402 is also read. An error check process is performed by the second parity check circuit 424 on the data read from the CAM 420. At the same time, an error check process is performed by the first parity check circuit 408 on the data read from the CAM 402. The results of these parity checks are input into the control circuit 430.

Having two parity results provides the control circuit 430 with four alternatives:

(1) both parity checks are correct (i.e., no error detected). No further action is required in an SRAM based CAM (unless the user desires that the SRAM cells be rewritten), DRAM based CAMs proceed with the refresh operation (data can be rewritten in the DRAM cells using either the contents of the CAM 420 or the shadow RAM 402);

(2) the data from the RAM 402 is correct (i.e., no error detected), but the data from the CAM 420 is erroneous (i.e., failed the parity check). The CAM 420 is rewritten with the data read from the RAM 402 (via RAM output register 404 and multiplexer 410);

(3) the data from the RAM 402 is erroneous (i.e., failed the parity check), but the data from the CAM 420 is correct (i.e., no error detected). The RAM 402 and the CAM 420 are rewritten with the data read from the CAM 420 (i.e., the first multiplexer 410 routes CAM data from the CAM output register 422 back into the CAM 420 and the second multiplexer 412 routes CAM data from the CAM output register 422 into the RAM under the control of the control circuit 430);

(4) the data from the RAM 402 and the CAM 420 are erroneous (i.e., failed the parity check). The control circuit 430 would report an error to the system controller (not shown).

Figure 5:
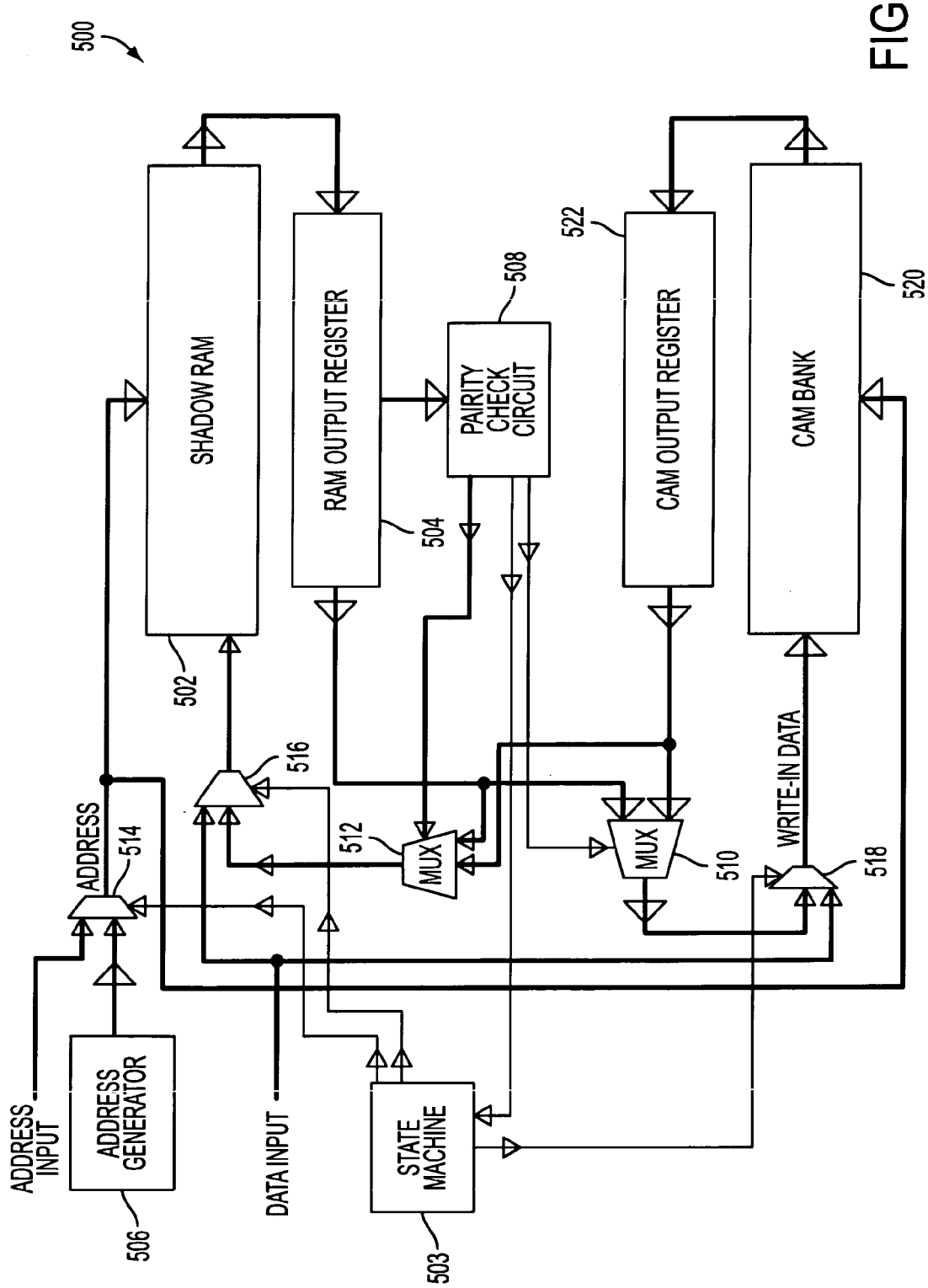
FIG. 5 is a block diagram illustrating portion of a CAM device comprising another exemplary error correction and detection circuit constructed in accordance with another embodiment of the invention.

FIG. 5 is a block diagram illustrating an example of a CAM device 500 comprising another exemplary error correction and detection circuit constructed in accordance with another embodiment of the invention. The device 500 comprises a shadow RAM 502, state machine 503, CAM 520, a RAM output register 504, an address generator 506, a parity check circuit 508, five multiplexers 510, 512, 514, 516, 518 and a CAM output register 522. The address generator 506 supplies address information ADDRESS to the RAM 502 and CAM 520 banks (via multiplexer 514 under the control of the state machine 503) during error detection and correction processing. During other processing (i.e., non-error detection and correction processing), an externally generated address input ADDRESS INPUT is sent to the RAM 502 and CAM 520 banks (via multiplexer 514 under the control of the state machine 503). The address generator 506 is controlled by the state machine 503, as described above with respect to FIG.1, to ensure that each location in the CAM 520 and RAM 502 is tested.

The shadow RAM 502 outputs its data to the RAM output register 504, which outputs the RAM data to the first multiplexer 510. Similarly, the CAM 520 outputs its data to the CAM output register 522, which outputs the CAM data to both multiplexer 510, 512. Both multiplexers 510, 512 are under the control of the parity check circuit 508. As will be described below, the first multiplexer 510 provides either the RAM data or the CAM data to the CAM 520 as write data WRITE DATA (via multiplexer 518 under the control of the state machine 503) when the contents of the CAM 520 need to be rewritten. As will be described below, the second multiplexer 512 provides CAM data to the RAM 502 (via multiplexer 516 under the control of the state machine 503) only when the contents of the RAM 502 need to be rewritten.

The RAM output register 504 also outputs the RAM data to the parity check circuit 508. The parity check circuit 508 determines if the RAM data has a parity error or not. The parity check circuit 508 outputs a first signal to the first multiplexer 510 and a second signal to the second multiplexer 512. This signals have a first value if the RAM data has a parity error and a second different value if the RAM data does not have a parity error.

In this embodiment, a parity check is only performed on the shadow RAM 502. Unless a parity error is detected on the RAM 502, the CAM 520 is rewritten with data from the RAM 502 (through the RAM output register 504, first multiplexer 510 under the control of the parity check circuit 508 and multiplexer 518 under the control of the state machine 503). As noted above, if the CAM 520 were comprised of SRAM cells, there is no need to re-write the CAM 520 unless desired by the user. When the CAM 520 is comprised of DRAM cells, the rewriting of the CAM data serves to complete the refresh operation. If the parity check circuit 508 detects an error, the CAM 520 and the RAM 502 are rewritten by data read from the CAM 520 (through the CAM output register 522, second multiplexer 512 under the control of the parity check circuit 508 and multiplexer 516 under the control of the state machine 503). This embodiment cannot detect an error on the same address simultaneously in both the RAM 502 and CAM 520 or any case of two simultaneous errors. This is the tradeoff for using a much simpler circuit 500 having fewer components and faster operation than other embodiments capable of detecting simultaneous errors. As in the other embodiments, input data DATA INPUT is input into the RAM 502 (via multiplexer 516) and CAM 520 (via multiplexer 518) during non-error detection and correction processing. The multiplexers 516, 518 are controlled by the state machine 503.

Figure 6:
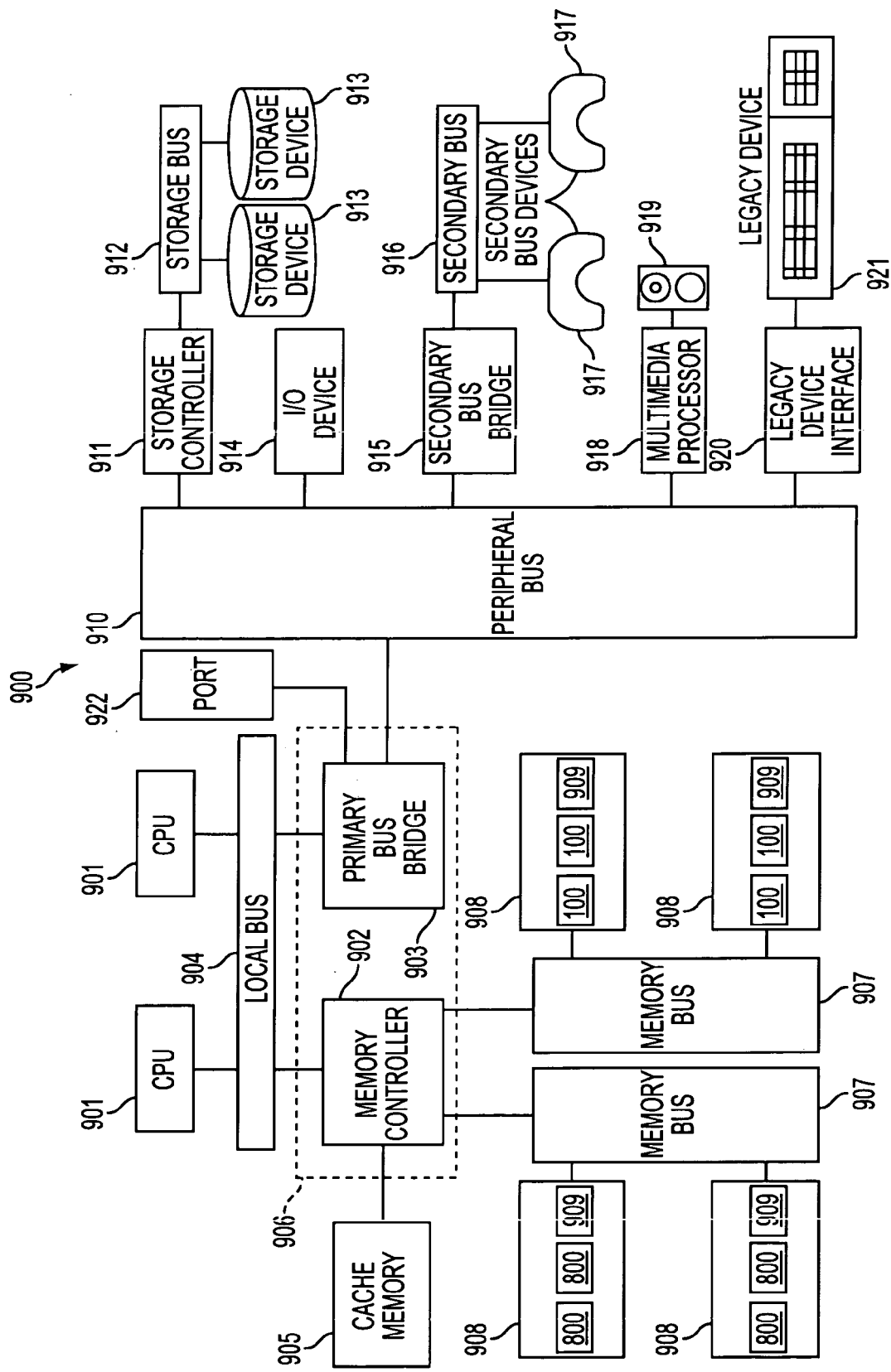
FIG. 6 is a block diagram illustrating a processor system utilizing a CAM constructed in accordance with an embodiment of the invention.

FIG. 6 illustrates an exemplary processing system 900 which may utilize a memory device 800 constructed in accordance with an embodiment of the present invention. That is, the memory device 800 is a CAM device having an error correction and detection circuit as illustrated in FIGS. 1–5.

The processing system 900 includes one or more processors 901 coupled to a local bus 904. A memory controller 902 and a primary bus bridge 903 arc also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 800 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 800. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

FIG. 7 is a simplified block diagram of a router 950 as may be used in a communications network, such as, e.g., part of the Internet backbone. The router 950 contains a plurality of input lines and a plurality of output lines. When data is transmitted from one location to another, it is sent in a form known as a packet. Oftentimes, prior to the packet reaching its final destination, that packet is first received by a router, or some other device. The router 950 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 950, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 7, the router 950 contains the added benefit of employing a semiconductor memory chip containing a CAM device 800, such as the CAM devices constructed in accordance with FIGS. 1–5. Therefore, not only does the router benefit from having a CAM but also benefits by having a CAM with error correction and detection.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

The invention claimed is:

1. A content addressable memory circuit comprising:
   a bank of memory cells; and
   an error detection and correction circuit connected to said bank, said error detection and correction circuit adapted to sequentially test said memory cells for errors, detecting errors within said cells and correcting any detected errors, said error detection and correction circuit comprises:
   an address generator for generating a test address for a memory cell to be tested, said address generator being connected to said bank,
   a state machine connected to said address generator, said state machine outputting a signal to said address generator when it is time to generate the test address, said state machine providing access signals to said bank when it is time to access the memory cell to be tested, and
   a test circuit connected to said bank, said test circuit inputting a content of said memory cell to be tested, determining whether the input content contains an error, and correcting the error if it is determined that said input content contains the error,
   wherein said test circuit uses additional memory bits associated with the memory cell to be tested to determine if the cell has the error and to correct the error.

2. The memory circuit of claim 1, wherein said test circuit uses a hamming code associated with the memory cell to be tested to determine if the cell has the error and to correct the error.

3. The memory circuit of claim 1, wherein said test circuit communicates the error to the state machine.

4. The memory circuit of claim 1, wherein said test circuit communicates that no error has occurred to the state machine when said test circuit determines that no error has been detected.

5. A content addressable memory circuit comprising:
   a bank of memory cells; and
   an error detection and correction circuit connected to said bank, said error detection and correction circuit adapted to sequentially test said memory cells for errors, detecting errors within said cells and correcting any detected errors, said error detection and correction circuit comprises:
   a bank of shadow memory, said bank of shadow memory containing a copy of data stored within said bank of memory cells,
   an address generator for generating a test address for a memory cell to be tested, said address generator being connected to said banks,
   a state machine connected to said address generator, said state machine outputting a signal to said address generator when it is time to generate the test address,
   a first test circuit being connected to said shadow memory bank, said test circuit inputting a content of said shadow memory corresponding to said memory cell to be tested, determining whether the input content of said shadow memory contains an error, and outputting a first signal if it is determined that said input content of said shadow memory contains the error,
   a second test circuit being connected to said bank of memory cells, said second test circuit inputting a content of said bank of memory cells corresponding to said memory cell to be tested, determining whether the input content of said bank of memory cells contains an error, and outputting a second signal if it is determined that said input content of said bank of memory cells contains the error, and
   a control circuit inputting said first and second signals, said control circuit determining whether there is an error in said bank of memory cells and said shadow memory based on said first and second signals.

6. The memory circuit of claim 5, wherein said control circuit copies data from said shadow memory into said bank of memory cells if it is determined that said bank of memory cells contains the error.

7. The memory circuit of claim 5, wherein said control circuit copies data from said bank of memory cells into said bank of shadow memory if it is determined that said bank of shadow memory contains the error.

8. The memory circuit of claim 5, wherein said control circuit copies data from said shadow memory into said bank of memories if it is determined that no error exists in either said shadow memory or said bank of memory cells.

9. The memory circuit of claim 5, wherein said control circuit copies data from said bank of memory cells into said bank of memories if it is determined that no error exists in either said shadow memory or said bank of memory cells.

10. A content addressable memory circuit comprising:
a bank of memory cells; and
an error detection and correction circuit connected to said bank, said error detection and correction circuit adapted to sequentially test said memory cells for errors, detecting errors within said cells and correcting any detected errors, said error detection and correction circuit comprises:
a bank of shadow memory, said bank of shadow memory containing a copy of data stored within said bank of memory cells,
an address generator for generating a test address for a memory cell to be tested, said address generator being connected to said banks,
a state machine connected to said address generator, said state machine outputting a signal to said address generator when it is time to generate the test address,
a test circuit being connected to said shadow memory bank, said test circuit inputting a content of said shadow memory corresponding to said memory cell to be tested, determining whether the input content of said shadow memory contains an error, and outputting a signal if it is determined that said input content of said shadow memory contains the error, and
a control circuit inputting said signal from said test circuit, said control circuit determining whether there is an error in said shadow memory and said bank of memory cells based on said signal.

11. The memory circuit of claim 10, wherein said control circuit copies data from said shadow memory into said bank of memory cells if it is determined that said shadow memory contains no errors.

12. The memory circuit of claim 10, wherein said control circuit copies data from said bank of memory cells into said bank of memory cells and said shadow memory if it is determined that said bank of shadow memory contains the error.

13. A processor system comprising:
a processor;
a content addressable memory circuit connected to and being responsive to commands from said processor, said memory circuit comprising:
a bank of content addressable memory cells, and
an error detection and correction circuit connected to said bank, said error detection and correction circuit testing said memory cells for errors, detecting errors within said cells and correcting any detected errors wherein said error detection and correction circuit resides on a same device as said bank and is adapted to correct multiple-bit errors, wherein said error detection and correction circuit comprises:

an address generator for generating a test address for a memory cell to be tested, said address generator being connected to said bank;
a state machine connected to said address generator, said state machine outputting a signal to said address generator when it is time to generate the test address, said state machine providing access signals to said bank when it is time to access the memory cell to be tested; and
a test circuit connected to said bank, said test circuit inputting a content of said memory cell to be tested, determining whether the input content contains an error, and correcting the error if it is determined that said input content contains the error.

14. The system of claim 13, wherein said test circuit uses additional memory bits associated with the memory cell to be tested to determine if the cell has the error and to correct the error.

15. The system of claim 13, wherein said test circuit uses a hamming code associated with the memory cell to be tested to determine if the cell has the error and to correct the error.

16. The system of claim 13, wherein said test circuit communicates the error to the state machine.

17. The system of claim 13, wherein said test circuit communicates that no error has occurred to the state machine when said test circuit determines that no error has been detected.

18. A processor system comprising:
a processor;
a content addressable memory circuit connected to and being responsive to commands from said processor, said memory circuit comprising:
a bank of content addressable memory cells, and
an error detection and correction circuit connected to said bank, said error detection and correction circuit testing said memory cells for errors, detecting errors within said cells and correcting any detected errors,
wherein said error detection and correction circuit comprises:
a bank of shadow memory, said bank of shadow memory containing a copy of data stored within said bank of memory cells;
an address generator for generating a test address for a memory cell to be tested, said address generator being connected to said banks;
a state machine connected to said address generator, said state machine outputting a signal to said address generator when it is time to generate the test address;
a first test circuit being connected to said shadow memory bank, said test circuit inputting a content of said shadow memory corresponding to said memory cell to be tested, determining whether the input content of said shadow memory contains an error, and outputting a first signal if it is determined that said input content of said shadow memory contains the error;
a second test circuit being connected to said bank of memory cells, said second test circuit inputting a content of said bank of memory cells corresponding to said memory cell to be tested, determining whether the input content of said bank of memory cells contains an error, and outputting a second signal if it is determined that said input content of said bank of memory cells contains the error; and
a control circuit inputting said first and second signals, said control circuit determining whether there is an error in said bank of memory cells and said shadow memory based on said first and second signals.

19. The system of claim 18, wherein said control circuit copies data from said shadow memory into said bank of memory cells if it is determined that said bank of memory cells contains the error.

20. The system of claim 18, wherein said control circuit copies data from said bank of memory cells into said bank of shadow memory if it is determined that said bank of shadow memory contains the error.

21. The system of claim 18, wherein said control circuit copies data from said shadow memory into said bank of memories if it is determined that no error exists in either said shadow memory or said bank of memory cells.

22. The system of claim 18, wherein said control circuit copies data from said bank of memory cells into said bank of memories if it is determined that no error exists in either said shadow memory or said bank of memory cells.

23. A processor system comprising:
a processor;
a content addressable memory circuit connected to and being responsive to commands from said processor, said memory circuit comprising:
a bank of content addressable memory cells, and
an error detection and correction circuit connected to said bank, said error detection and correction circuit testing said memory cells for errors, detecting errors within said cells and correcting any detected errors,
wherein said error detection and correction circuit comprises:
a bank of shadow memory, said bank of shadow memory containing a copy of data stored within said bank of memory cells;
an address generator for generating a test address for a memory cell to be tested, said address generator being connected to said banks;
a state machine connected to said address generator, said state machine outputting a signal to said address generator when it is time to generate the test address;
a test circuit being connected to said shadow memory bank, said test circuit inputting a content of said shadow memory corresponding to said memory cell to be tested, determining whether the input content of said shadow memory contains an error, and outputting a signal if it is determined that said input content of said shadow memory contains the error; and
a control circuit inputting said signal from said test circuit, said control circuit determining whether there is an error in said shadow memory and said bank of memory cells based on said signal.

24. The system of claim 23, wherein said control circuit copies data from said shadow memory into said bank of memory cells if it is determined that said shadow memory contains no errors.

25. The system of claim 23, wherein said control circuit copies data from said bank of memory cells into said bank of memory cells and said shadow memory if it is determined that said bank of shadow memory contains the error.

26. A method of performing error detection and correction in a content addressable memory, said method comprising:
copying data stored within the content addressable memory into a shadow memory;
generating a test address for a memory cell within the content addressable memory to be tested;
inputting a content of the shadow memory corresponding to said memory cell to be tested;
determining whether the input content of said shadow memory contains an error;
generating a first signal if it is determined that the input content of the shadow memory contains the error;
inputting a content of the content addressable memory corresponding to the memory cell to be tested;
determining whether the input content of the content addressable memory contains an error;
generating a second signal if it is determined that the input content of the content addressable memory contains the error;
determining whether there is an error in the content addressable memory bank and the shadow memory based on the first and second signals; and
correcting the error by rewriting the data in the content addressable memory bank and the shadow memory based on the first and second signals.

27. The method of claim 26, further comprising the step of copying data from the shadow memory into the content addressable memory if it is determined that the content addressable memory contains the error.

28. The method of claim 26, further comprising the step of copying data from the content addressable memory into the shadow memory if it is determined that the shadow memory contains the error.

29. The method of claim 26, further comprising the step of copying data from the shadow memory into said content addressable memory and the shadow memory if it is determined that no error exists in either the shadow memory or the content addressable memory.

30. The method of claim 26, further comprising the step of copying data from the content addressable memory into the content addressable memory and the shadow memory if it is determined that no error exists in either the shadow memory or the content addressable memory.

31. A method of performing error detection and correction in a content addressable memory, said method comprising:
copying data stored within the content addressable memory into a shadow memory;
generating a test address for a memory cell to be tested;
inputting a content of the shadow memory corresponding to the memory cell to be tested;
determining whether the input content of the shadow memory contains an error;
outputting a first signal if it is determined that the input content of the shadow memory contains the error;
determining whether there is an error in the content addressable memory based on the first signal; and
correcting the error by rewriting the data in the content addressable memory bank and the shadow memory based on the first and second signals.

32. The method of claim 31, further comprising the step of copying data from the shadow memory into the content addressable memory if it is determined that said memory contains no errors.

33. The method of claim 31, further comprising the step of copying data from said the content addressable memory into the content addressable memory and the shadow memory if it is determined that the shadow memory contains the error.

* * * * *

UNITED STATES PATENT AND TRADEMARK OFFICE
CERTIFICATE OF CORRECTION

PATENT NO.       : 7,237,172 B2
APPLICATION NO.  : 10/327071
DATED            : June 26, 2007
INVENTOR(S)      : Alon Regev et al.

It is certified that error appears in the above-identified patent and that said Letters Patent is hereby corrected as shown below:

Column 2:

Lines 57 and 61, "illustrating portion" should read --illustrating a portion--.

Column 4:

Line 18, "and" should read --an--.

Column 10:

Line 40, "include" should read --includes--;

Lines 50-51, "an miscellaneous" should read --a miscellaneous--;

Line 52, "an legacy" should read --a legacy--;

Line 53, "also coupled" should read --also be coupled--;

Line 63, "an local" should read --a local--; and

Line 67, "an universal" should read --a universal--.

Column 11:

Line 1, "via to the" should read --via the--; and

Line 4, "to one additional" should read --to additional--.

Claim 1, column 12, lines 3-4, "comprises" should read --comprising--;

Claim 5, column 12, lines 38-39, "comprises" should read --comprising--; and

UNITED STATES PATENT AND TRADEMARK OFFICE
CERTIFICATE OF CORRECTION

PATENT NO. : 7,237,172 B2
APPLICATION NO. : 10/327071
DATED : June 26, 2007
INVENTOR(S) : Alon Regev et al.

It is certified that error appears in the above-identified patent and that said Letters Patent is hereby corrected as shown below:

Claim 31, column 16, line 50, delete "and" and insert the following at line 51:

--outputting a second signal if it is determined that the content memory contains an error; and--

Signed and Sealed this

Eleventh Day of September, 2007

JON W. DUDAS
*Director of the United States Patent and Trademark Office*